(12) United States Patent
Lee et al.

(10) Patent No.: US 7,672,803 B1
(45) Date of Patent: Mar. 2, 2010

(54) INPUT OF TEST CONDITIONS AND OUTPUT GENERATION FOR BUILT-IN SELF TEST

(75) Inventors: Mimi Lee, Santa Clara, CA (US); Darlene Hamilton, San Jose, CA (US); Ken Cheong Cheah, Penang (MY)

(73) Assignee: Spansion LLC, Sunnyvale, CA (US)

( * ) Notice: Subject to any disclaimer, the term of this patent is extended or adjusted under 35 U.S.C. 154(b) by 50 days.

(21) Appl. No.: 11/006,034

(22) Filed: Dec. 7, 2004

(51) Int. Cl.
*G01R 27/28* (2006.01)
(52) U.S. Cl. .................................... 702/117
(58) Field of Classification Search ............... 702/117, 702/118–120
See application file for complete search history.

(56) References Cited

U.S. PATENT DOCUMENTS

| 6,343,366 B1* | 1/2002 | Okitaka ...................... 714/733 |
| 6,667,918 B2* | 12/2003 | Leader et al. ................ 365/201 |
| 6,760,865 B2* | 7/2004 | Ledford et al. ................ 714/30 |
| 2003/0223297 A1 | 12/2003 | Fukuyama |

FOREIGN PATENT DOCUMENTS

EP 1 388 788 A1 2/2004

OTHER PUBLICATIONS

International Search Report, Int'l Application No. PCT/US2006/002246, Int'l Filing Date Jan. 23, 2006, 3 pgs.

* cited by examiner

*Primary Examiner*—Drew A Dunn
*Assistant Examiner*—Stephen J Cherry
(74) *Attorney, Agent, or Firm*—Eschweiler & Associates, LLC

(57) ABSTRACT

A system and method is discussed for providing programmable test conditions for a built-in self test circuit of a flash memory device. The present invention employs a flash memory having BIST circuit for testing the memory and a BIST interface circuit adapted to adjust the test conditions of the memory tests. The BIST interface circuit is operable to receive one or more global variables associated with the test conditions of a plurality of tests used on the flash memory and to output results of the memory tests based on the value of the variables. The global variables are used to adjust the test conditions and to trim one or more references used in various flash memory tests and operations. The system may further include a serial communications medium for communicating the global variables to the BIST interface and test results from the interface.

34 Claims, 12 Drawing Sheets

TEST SEQUENCE

GLOBAL VARIABLE
SEQUENCE

COMMAND
SEQUENCE

TEST RESULTS
SEQUENCE

TEST SEQUENCE — 600

| TEST: | REFERENCE TRIMMING | CKBD PROG/READ | ERASE |
|---|---|---|---|
| TEST #: | 1 | 2 | 3 |

Fig. 6A

GLOBAL VARIABLE SEQUENCE — 650

| VALUE #: | 1 | 01 | 10 | 11 | 11 | 01 | 01 | 0111 |
|---|---|---|---|---|---|---|---|---|
| VARIABLE: | REPAIR | $V_D$ PROG | $V_G$ VERIFY | $V_D$ PROG | $V_G$ PROG | $V_G$ ERASE | $V_D$ ERASE | Max Erase Pulses |
| TEST #: | 2 | 1 | 2 | 2 | 2 | 3 | 3 | 3 |

TEST RESULTS SEQUENCE ← 700

| VALUE #: | 00 | 01 | 10 |
|---|---|---|---|
| TEST: | REFERENCE TRIMMING OUTPUT | CKBD PROG/READ OUTPUT | ERASE OUTPUT |

OUTPUT RESULTS
00 = PASS
01 = FAIL
10 = PASS with REPAIR
11 = FAIL with REPAIR

Fig. 7

GLOBAL VARIABLE SETTINGS

| GLOBAL VARIABLE | #BITS | #STEPS |
|---|---|---|
| $V_D$PROG | 2 | 4 |
| $V_D$ERASE | 3 | 8 |
| $V_G$PROG | 2 | 4 |
| $V_G$ERASE | 3 | 8 |

| MAX # PULSES | | |
|---|---|---|
| CKBD PROG. | 4 | 16 |
| DIAG PROG. | 4 | 16 |
| MAX ERASE PULSES CODE | 4 | 16 |

| TRIM SETTINGS | | |
|---|---|---|
| IREF(A) | 3 | 8 |
| IREF(B) | 3 | 8 |
| IREF(C) | 3 | 8 |

| | | |
|---|---|---|
| PROG. STRESS SELECT | 1 | --- |
| REPAIR / NO-REPAIR SELECT | 1 | --- |

Fig. 10

INPUT OF TEST CONDITIONS AND OUTPUT GENERATION FOR BUILT-IN SELF TEST

RELATED APPLICATIONS

This application is related to U.S. patent application Ser. No. 11/041,608 filed Jan. 24, 2005, which is entitled "AUTOMATED TESTS FOR BUILT-IN SELF TEST".

FIELD OF INVENTION

The present invention relates generally to memory devices and the like, and in particular to a system and method of inputting programmable global variables to and obtaining output from built-in self test circuits for self testing flash memory products.

BACKGROUND OF THE INVENTION

Improvements in semiconductor processes are making possible integrated circuits of increasing size and complexity. The semiconductor processing technologies that produce these integrated circuits have advanced to the point where complete systems, including memories, can now be reduced to a single integrated circuit or application specific integrated circuit (ASIC) device. These integrated circuits (also referred to as "die" or "chips") may use many functions that previously could not be implemented on a single die. It is a common practice for the manufacturers of such integrated circuits to thoroughly test device functionality at the manufacturing site. However, due to the complex nature of today's integrated circuits and an attendant sensitivity to variations in manufacturing processes, manufacturers are constantly confronted with new testing challenges.

Before manufacturers release integrated circuits for shipment, the devices typically undergo a variety of testing procedures. In ASIC devices incorporating integrated memories, for example, specific tests are performed to verify that each of the memory cells within the integrated memory array(s) is functioning properly. This testing is necessary because perfect yields are difficult to achieve. It is not uncommon for a certain percentage of unpackaged ASIC die to contain memory cells which fail testing processes, due largely to non-systemic manufacturing defects. Such manufacturing issues are likely to increase as process geometries continue to shrink and the density of memory cells increases. Even today, up to 1 Gbits or more of dynamic random access memory (DRAM), static random access memory (SRAM) or flash memory can be integrated onto a single integrated circuit.

A number of ASIC memory testing strategies have evolved, many of which involve use of an external memory tester or Automated Test Equipment (ATE). If memory is accessible from input/output (I/O) pins, a hardware test mode can be utilized. In this mode, a production test system accesses the memory directly by writing to and reading from the memory bits. The main disadvantage of using such standard test modes is that the test system must test the devices interactively. Consequently, only a limited number of devices can be tested at a given time, and a significant amount of overhead time is incurred due to tester limitations (e.g., power up time is needed on certain pins while the mode is being accessed and while the tester is controlling the chip and checking the results).

If an embedded memory is embedded within an ASIC, built-in self-test (BIST) is often considered the most practical and efficient test methodology and is becoming increasingly popular with semiconductor vendors. BIST allows timely testing of the memory with a reasonably high degree of fault coverage, without requiring continual interactive (sequential) control via external test equipment.

BIST refers in general to any test technique in which the testing algorithm or test vectors are generated internal to a discrete memory, an integrated circuit, or ASIC device. The testing algorithm used in BIST may be generally implemented in embedded circuitry of the device. Test vectors are sequences of signals that are applied to integrated circuitry to determine if the integrated circuitry is performing as designed. BIST can be used to test these memories located anywhere on the device.

In the BIST approach, a test pattern generator and test response analyzer are incorporated directly into the device to be tested. BIST operation is controlled by supplying an external clock and via use of a simple commencement protocol. BIST testing is typically distilled to the level of a "passed" or "failed" result. At the end of a typical structured BIST test, or "run", a simple pass/fail signal is asserted, indicating whether the device passed or failed the test. Intermediate pass/fail signals may also be provided, allowing individual memory locations or group of locations to be analyzed.

Unlike external testing approaches, at-speed testing with BIST is readily achieved. BIST also alleviates the need for long and convoluted test vectors and may function as a surrogate for functional testing or scan testing. Since the BIST structures exist and remain active throughout the life of the device, BIST can be employed at the board or system level to yield reduced system testing costs, reduce device rejects during production, and to reduce field diagnosis costs.

Many different types and styles of memory exist to store data for computers and similar type systems, wherein BIST circuits may be implemented. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage. Each type of memory has its own particular advantages and disadvantages.

Flash memory has become a popular type of memory because it combines the advantages of the high density and low cost of EPROM with the electrical erasability of EEPROM. Flash memory can be rewritten and can hold its contents without power, and thus is nonvolatile and is suitable for BIST circuitry and testing methods. Flash memory is used in many portable electronic products, such as cell phones, portable computers, voice recorders, etc. as well as in many larger electronic systems, such as cars, planes, industrial control systems, etc.

Individual memory cells are organized into individually addressable units or groups, which are accessed for read, program, or erase operations through address decoding circuitry. The individual memory cells are typically comprised of a semiconductor structure adapted for storing a bit of data and includes appropriate decoding and group selection circuitry, as well as circuitry to provide bias and reference voltages and currents to the cells being operated upon. Carefully trimming or controlling such bias and reference voltages is essential to proper memory operations, but requires considerable test time if conventional testers are used to test devices which do not have BIST.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

In a NOR configuration, the control gate is connected to a wordline associated with a row of memory cells to form sectors of such cells. In addition, the drain regions of the cells along a given column are connected together by a conductive bitline. Respective flash cells associated with a given bitline have stacked gate terminals coupled to a different wordline, while all the flash cells in the array generally have their source terminals coupled to a common source terminal. In operation, individual flash cells are addressed via the respective bitline and wordline using the peripheral decoder and control circuitry for programming (writing), reading or erasing functions.

Programming circuitry controls a bit of a cell by applying a signal to the wordline, which acts as a control gate, and changing bitline connections such that the bit is stored by the source and drain connections. Erasing is performed as a blanket operation wherein an array or sector of cells can be simultaneously erased. Generally, a gate voltage is applied to the control gates via the wordline(s) and a drain voltage is applied to the drains via the bitlines, while the sources may be configured to float.

In the blanket erasing of flash memory, cells within an array or sector are typically erased concurrently and can be accomplished by one or more applications of short erase pulses. After each erase pulse, an erase verification can be performed to determine if each cell in the array is now "erased" (blank), or yet remains "un-erased" or "under-erased", (i.e., whether the cell has a threshold voltage above a predetermined limit). If an under-erased cell is detected, an additional erase pulse can be applied to the entire array. With such an erase procedure, however, cells that are sufficiently erased initially will also be repeatedly erased, leading to some cells becoming "over-erased" before other cells are sufficiently erased. A memory cell having a threshold voltage erased below a predetermined limit is commonly referred to as being over-erased. An over-erased condition is undesirable for many reasons.

In addition, testing algorithms used in BIST often attempt to determine a representative group of memory cells associated with a representative erase threshold level, by selecting edge columns, edge rows, or diagonal groupings of memory cells representative of the entire sector or array. Each grouping selection has a unique advantage, attempting to provide the representative erase level or a corresponding representative number of erase pulses required. Regardless of the grouping selected, however, a truly representative erase threshold level for the sector or array of memory cells is elusive, as differences exist between memory arrays and/or the particular ASIC application wherein the array resides. Further, the aforementioned grouping choices may not be sufficiently representative of the desired erase threshold level, and also may be difficult to implement in BIST circuitry.

As a result of the aforementioned tests required by BIST, implementing such test choices, voltages, and other variations in BIST circuitry traditionally requires mask changes that may be prohibitively expensive and time consuming.

Thus, as device scaling trends continue, there is a desire to improve on the capabilities and flexibility of BIST, while minimizing the design complexity and real estate required of BIST circuitry. Accordingly, a need exists for a method of adjusting the test conditions of BIST tests implemented in BIST circuits for self testing a flash memory device.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention provides an effective software controlled system and method that permits interactive adjustment of the various test conditions utilized by BIST test circuitry. It is an objective of the system and method of the present invention to provide the capability to adjust the test conditions via software control, thereby eliminating the need to do so via mask changes that may be prohibitively expensive and time consuming. It is another objective of the present invention to enable the interactive adjustment of test condition based on results executed as part of the BIST sort flow. It is still another objective of the invention to enable interactive adjustment of the internal voltage and current references to levels required for correct part operation and optimal part yield. Such interactive software control and adjustment of test conditions simplifies the use of BIST without the traditional mask changes. The test conditions determined during part characterization, debug, and the qualification process effectively provide for screening out parts which would eventually fail in later testing, or otherwise become reliability failures. A predefined sequence of global variables associated with the test conditions is communicated to a BIST interface circuit. The global variables comprise one or more bits of a multi-bit code representing a variable value associated with one or more BIST tests. The BIST interface is adapted to receive the variables and adjust corresponding test conditions based on the variable value. For example, a variable code "10" in the predefined sequence may represent a gate voltage of 3.7V used in one or more BIST tests.

In an aspect of the present invention, the BIST interface may be employed as an integral portion of the BIST circuitry.

In a preferred implementation of the present invention, the predefined global variable sequence is serially communicated to the BIST interface to minimize the number of test pins used in contact with the chip under test. Alternately, parallel communications and other forms of communication are contemplated in the context of the present invention. In yet another aspect of the invention, automatic test equipment may be used to communicate with the BIST interface. The BIST interface, then, establishes the conditions for one or more tests executed by the BIST circuit on one or more associated Flash memory circuits.

The BIST interface, in one aspect of the invention, comprises a state machine coupled to the BIST circuit for executing test sequences according to the test conditions established by the global variables. The BIST interface further comprises an input buffer to communicate the global variables into the state machine, and an output buffer to communicate the results of the tests executed by the state machine thru the BIST circuitry. In another aspect of the invention, the system comprises at least one redundant circuit for repair purposes, and is adapted to direct the BIST circuitry to repair a failure.

Typically, BIST uses a fixed set of test conditions, wherein the pass/fail test results will stand regardless of the application or conditions. By contrast, the present invention permits adjustment of the variables of the various test conditions to improve on the capabilities and flexibility of BIST. In this way, test conditions for the BIST tests can be adjusted as needed for the application.

The present invention further provides a serial protocol for communicating the predefined sequence of global variables to the BIST interface and BIST circuitry to provide adjustment of the associated test conditions. The serial communications protocol of the present invention may be communicated serially between the BIST interface and automated test equipment (ATE) or to other such test equipment. In still another aspect of the present invention, the protocol comprises the default variable value, for example, programmed in a metal mask and offset by the global variable. The predefined sequence of global variables comprises a first predetermined test code (e.g., a three-bit, a four-bit, or a multi-bit binary code) occurring before a global variable sequence, and a second predetermined test code before an on/off test indications sequence.

In accordance with one aspect of the invention, the communications protocol comprises a test results sequence of test result indications represented by a result code (e.g., a two-bit binary code). For example, the result code comprises a pass or fail indication in one bit and a pass with repair or fail with repair indication in another bit.

In another aspect of the present invention, one or more global variables comprise one or more bits of a multi-bit code corresponding to a drain voltage, a gate voltage, a reference voltage, a reference current, a maximum number of pulses used in a checker board pattern test, a maximum number of pulses used in a diagonal pattern test, a maximum number of pulses used in an erase test, a maximum number of pulses used in a zeroes program test, a repair/no repair selection, and a program stress and read/read only selection.

In another aspect of the present invention, a pattern to be used during the read test may be selected by a global variable (e.g., XMNMX or YMNMX).

The BIST interface is adapted to allow such adjustments to various test conditions and to affect trim settings of reference voltages and reference currents used by the system.

In accordance with another aspect of the present invention, a method enables programmable self-test conditions by providing a BIST interface adapted to adjust a test condition used in a BIST circuit, providing a Flash memory comprising the sector of memory cells, providing the BIST circuit adapted to test the flash memory, communicating with the BIST interface one or more global variables associated with the test condition, adjusting the test condition used by the BIST circuit based on the values represented by the global variables, performing one or more test operations on the flash memory in accordance with the adjusted test condition, and reporting the results of the memory test operations. Thus, the method of the present invention tests a sector or array of memory cells utilizing BIST test circuitry having adjustable test conditions by communicating (e.g., serially) programmable (e.g., via ATE or other such test equipment) global variables to a BIST interface adapted to receive and adjust a variety of test conditions associated with the BIST tests. The present invention is implemented in a BIST circuit associated with the memory to reduce testing time, costs, and to improve on the capabilities and flexibility of BIST.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIGS. 6A, 6B, & 6C are block diagrams of exemplary tests and variables as may be used in the test sequence, global variable sequence, and test results code sequences of FIGS. 5A, 5B, & 5D, respectively FIG. 7 is a table of exemplary test output results as may be reported in the test results code sequence illustrated in FIG. 6C.

FIG. 10 is a table of exemplary global variable settings as may be used in the global variable and command sequences illustrated in FIGS. 5B and 5C for the self-test protocol of the present invention.

DETAILED DESCRIPTION OF THE INVENTION

Figure 1:
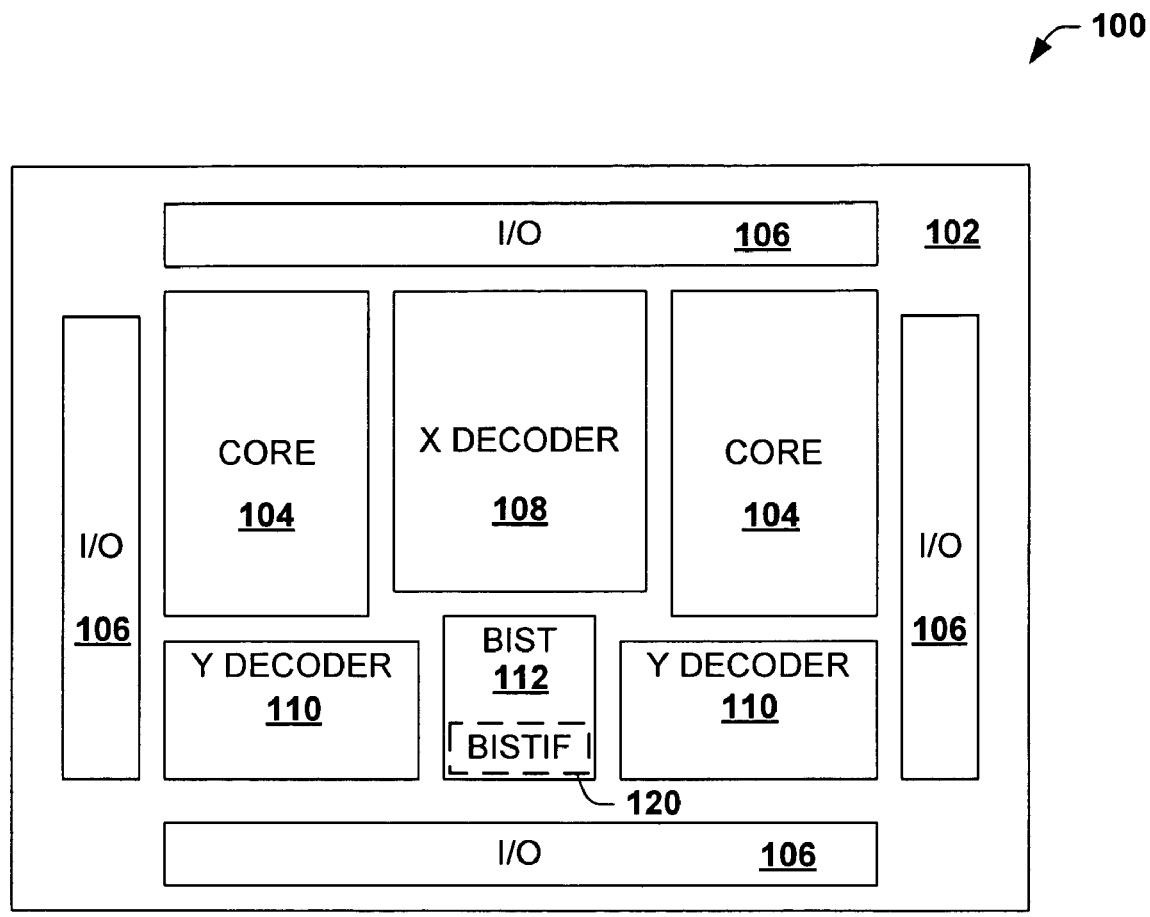
FIG. 1 is a top view of a flash memory device having BIST circuitry and an integral BIST interface in accordance with an aspect of the present invention.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

A self-test system and protocol may be used to program variable test conditions for a built-in self test circuit of a Flash memory device including a sector or an array of memory cells. The self-test protocol of the present invention is suitably implemented as a circuit that may be included as "built-in self test" BIST circuitry on an ASIC device, for example. The protocol preferably employs a BIST interface that may be integrated within the BIST circuitry or an independent circuit associated with the Flash memory device. Although the present invention is discussed in the context of a hardware implementation, the protocol may also be implemented in firmware, software or another such medium.

Full built-in self test (BIST) refers to the on-chip capability to execute all of the tests normally done with a conventional wafersort tester. With BIST, all die on a wafer may be given the "test" command at the same time, enabling each die to "test itself" concurrently without further tester intervention. Since all die on the wafer are tested generally in parallel, the test time is reduced to the time that it takes approximately to test one die, as compared to conventional wafersort testing wherein die are tested one group at a time (e.g., 16, 32, etc. die/group). This dramatic decrease in testing time reduces the test cost greatly. Accordingly, fewer testers are needed to test a given number of wafers, and wafer lots can be processed in considerably less time. All of the tests, which are normally included as part of the wafersort testing can be included in the BIST test flow.

The BIST interface of the present invention is, for example, part of the BIST circuitry included on each device of the wafer. It is used to input the test conditions (e.g., voltage, number of pulses) for each test in the BIST test flow, and to output the results of each test (e.g., passed, failed, passed with repair, or failed with repair) in an encoded format.

In the system of the present invention, a predefined sequence of tests and global variables associated with the tests are communicated between, for example, automated test equipment (ATE) or other such test equipment and a BIST interface circuit. Preferably, the predefined sequence is serially communicated with the BIST interface to minimize the number of test pins, since it may be impractical to include a probe for all pads on each device, due to probecard/tester limitations. Although serial communications is discussed herein, it will be understood by those skilled in the art, that parallel communications and other such forms of communication are also contemplated in the context of the present invention. The global variables comprise one or more bits of a multi-bit code representing a variable value associated with one or more BIST tests and corresponding test conditions. The BIST interface is adapted to receive the variables and adjust corresponding test conditions based on the variable value. Thus, the test equipment may, in accordance with the protocol of the present invention, adjust the variables associated with the various BIST test conditions via software control to improve on the capabilities and flexibility of BIST.

For example, from reliability studies, it may be determined that if a die requires more than 128 pulses to program a CKBD pattern, the die will eventually become a reliability failure. In response, using the system and protocol of the present invention, the "Maximum number of Pulses" for the CKBD PROG may be set by software control to a code corresponding to "128 pulses" to screen-out any die that requires more than 128 pulses to program the CKBD pattern. In another example, employing the system and protocol of the present invention, certain variables and reference levels may be optimally set or trimmed within the devices on each wafer to levels required for correct part operation and optimal part yield. Thus, the need to do so by much more expensive and time consuming mask changes may be eliminated.

In addition, the variables for the test conditions may be interactively adjusted in the present invention based on results executed as part of the BIST sort flow. This can be a critical requirement depending on the technology utilized. Thus, BIST testing operations are enabled to interactively adjust the internal voltages and current references to levels required for correct part operation, based on these results. Such interactive software control and adjustment of test conditions simplifies the use of BIST without the traditional mask changes. Test conditions determined during part characterization, debug, and the qualification process effectively provide for screening out parts which would eventually fail in later testing, or otherwise become reliability failures. The self-test system and protocol of the present invention provides an improved software variable alternative to the fixed test condition systems used in prior BIST circuits.

For example, by turning the appropriate tests on and off, a reference trim test may be executed using a specified verify gate voltage, followed by several executions of a blank test, each test performed at a different specified gate voltage. Based on these results, the program could then determine if the verify gate voltage used during reference trim had a correct value. If it was determined that the reference trim was not the correct value, the program can re-execute the reference trim test using a verify gate voltage which has been adjusted by an appropriate amount, as determined by the result of the blank tests.

Conventional wafersort testing is accomplished using automated test equipment (ATE). ATE equipment often contains complex circuitry including a number of registers along with the various application test algorithms to support the various ASIC devices to be tested. Initially, this arrangement was beneficial to perform testing functions in a central piece of testing equipment, thereby avoiding hardware and real estate duplication. However, partially because of the added wiring lengths and signal delays involved, ATE testing may add significant testing times, parasitic signal instabilities and testing uncertainties in contrast to BIST solutions. Fortunately, as ASIC device densities and scaling have improved, chip real estate costs have correspondingly plummeted. For these and other reasons, BIST circuit solutions have increasingly become the norm while significantly adding value to these devices.

Referring initially to FIG. 1, a top view of an exemplary flash memory device 100 having BIST circuitry in accordance with an aspect of the present invention is illustrated. The memory device 100 generally includes a semiconductor substrate 102 in which one or more high-density core regions 104 and one or more peripheral portions are formed. The core regions 104 typically include one or more M by N arrays 104 of individually addressable, substantially identical flash memory cells. The peripheral portions on the other hand typically include input/output (I/O) circuitry 106 and programming circuitry for selectively addressing the individual memory cells. The programming circuitry is represented in part by, and includes, one or more x-decoders 108 and one or more y-decoders 110 that cooperate with the I/O circuitry 106 for selectively connecting an element of selected addressed memory cells to predetermined voltages or impedances to effect designated operations on the respective memory cells (e.g., programming, reading, erasing, and deriving necessary voltages to effect such operations).

The present invention further incorporates a built-in self test circuit BIST 112 that, for example, may be used to test the individual memory cells, words, groups, pages, sectors or other such portions or groupings of cells of the array 104 including other regions of the device 100. In addition, the self-test system and protocol of the present invention is suitable for memories and other semiconductor devices comprising memories including ASIC devices.

Built-in self test circuit BIST 112, further comprises an integral BIST interface circuit 120 in accordance with an aspect of the present invention. The BIST interface circuit 120 of device 100 is adapted to communicate and receive global variables associated with the test conditions of tests performed by BIST circuitry 112 on the flash memory device 100. The global variables are used by the BIST interface 120 and the BIST circuitry 112 to adjust the test conditions and also to trim a reference used in various flash memory tests and operations. The BIST circuit 112 tests the flash memory based on the value of the variables programmed into the test conditions and reports the test results to the BIST interface 120, which outputs results of the memory tests.

Figure 2:
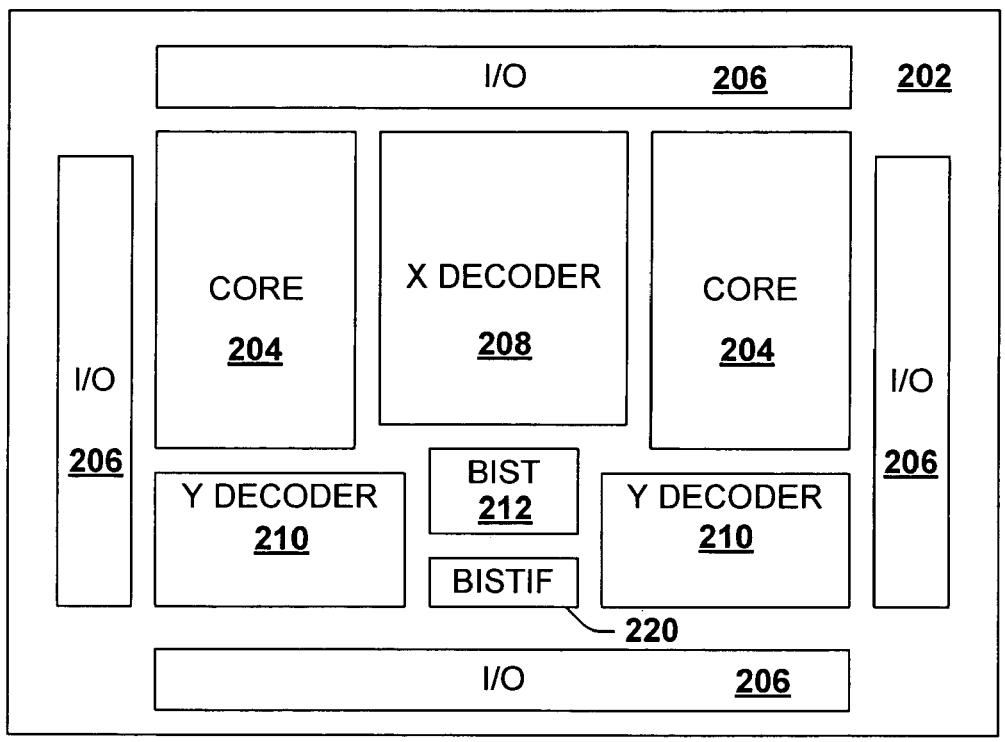
FIG. 2 is a top view of a flash memory device having BIST circuitry and a separate BIST interface in accordance with an aspect of the present invention.

Referring now to FIG. 2, a top view of an exemplary flash memory device 200 having BIST circuitry 212 and a separate BIST interface 220 in accordance with an aspect of the present invention is illustrated. The memory device 200 is similar to that of the memory 100 depicted in FIG. 1, and as such need not be fully described again for the sake of brevity. BIST interface circuit 220 of device 200 is adapted to communicate and receive global variables associated with the test conditions of tests performed by BIST circuitry 212 on the flash memory device 200. The global variables are used by the BIST interface 220 and the BIST circuitry 212 to adjust the test conditions and also to trim a reference used in various flash memory tests and operations. The BIST circuit 212 tests the flash memory based on the value of the variables programmed into the test conditions and reports the test results to the BIST interface circuit 220, which outputs results of the memory tests.

BIST interface 220 of memory device 200 as shown, may be separate from the BIST circuitry 212, 112, or may, for example, be integrated together with BIST circuitry 212, 112.

Figure 3:
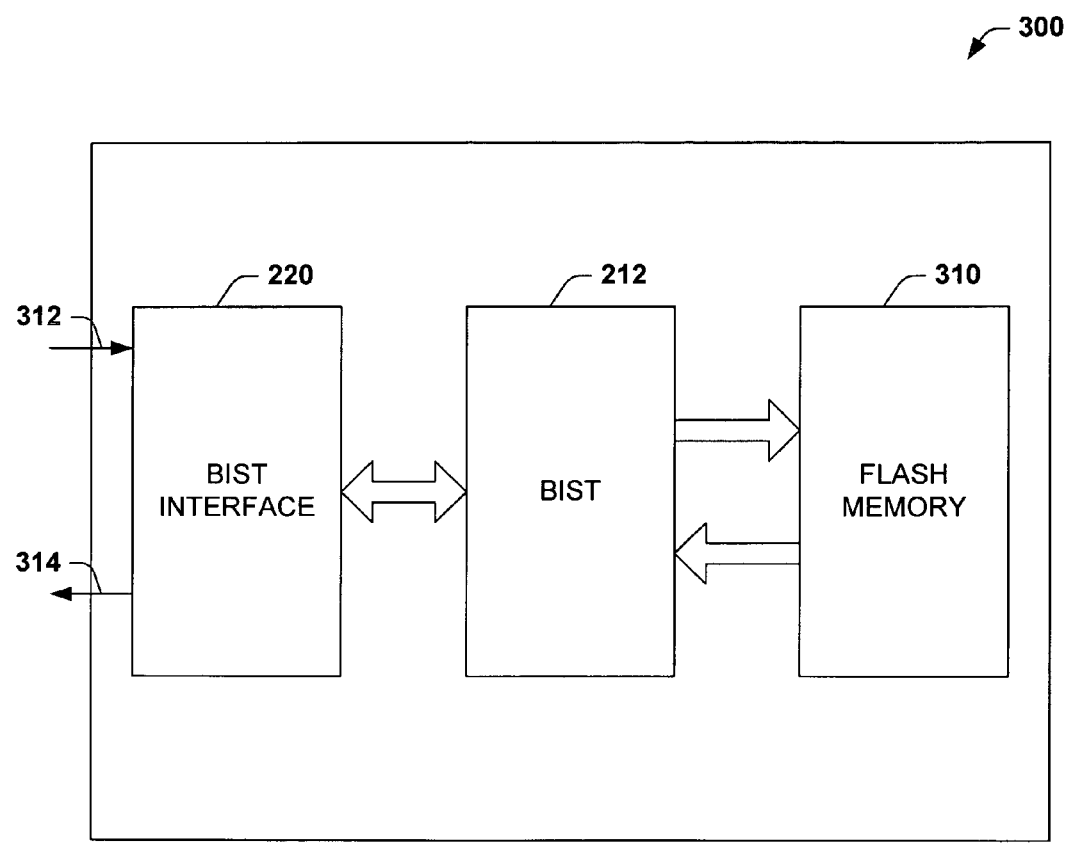
FIG. 3 is a block diagram of a flash memory device having BIST circuitry and a BIST interface in accordance with an aspect of the present invention.

FIG. 3 illustrates a block diagram of an exemplary flash memory device 300 comprising a BIST circuit 212, a BIST interface 220, and a flash memory 310 in accordance with an aspect of the present invention. The BIST interface circuit 220 of the memory device 300 is adapted to communicate (e.g., serially) and receive an input 312 of one or more global variables associated with the test conditions of a plurality of tests performed by the BIST circuitry 212 on the flash memory 310. The Flash memory 310, for example, may comprise one or more sectors of one or more arrays and other associated support circuitry of the flash memory device 300.

The global variables 312 are used by the BIST interface 220 and the BIST circuitry 212 to adjust the test conditions and to trim references (e.g., reference currents and voltages) used in various flash memory tests and operations. The BIST circuit 212 then tests operations of the flash memory 310 based on the value of the variables programmed into the test conditions and reports the results of the memory tests to the BIST interface circuit 220. Upon completion of the tests, the BIST interface circuit 220 is further operable to communicate (e.g., serially) an output 314 of the results of the memory tests in accordance with the invention.

It will be appreciated that the inputs 312 and outputs 314 of the BIST interface 220 have contacts and interconnections (not shown) for connection to ATE or other wafersort test equipment, for example, available to device manufacturers during wafer sort testing. Alternately, or in addition, such contacts and interconnections of the memory device may be adapted to support communications between the BIST interface and a user of the memory device for specialized aftermarket testing or reference trimming.

Because of the differences which exist between memory arrays and/or the particular ASIC application wherein the array resides, accommodation to these variables may directly relate to the usefulness of a memory device in an application. Compared to the self-test system and protocol of the present invention, conventional BIST systems do not support adjustment of the complete array of test conditions and hardware variables outlined in the present invention. Thus, the present invention may be able to provide a more flexible BIST system interactively and more simply adapted to the devices under BIST test.

Figure 4:
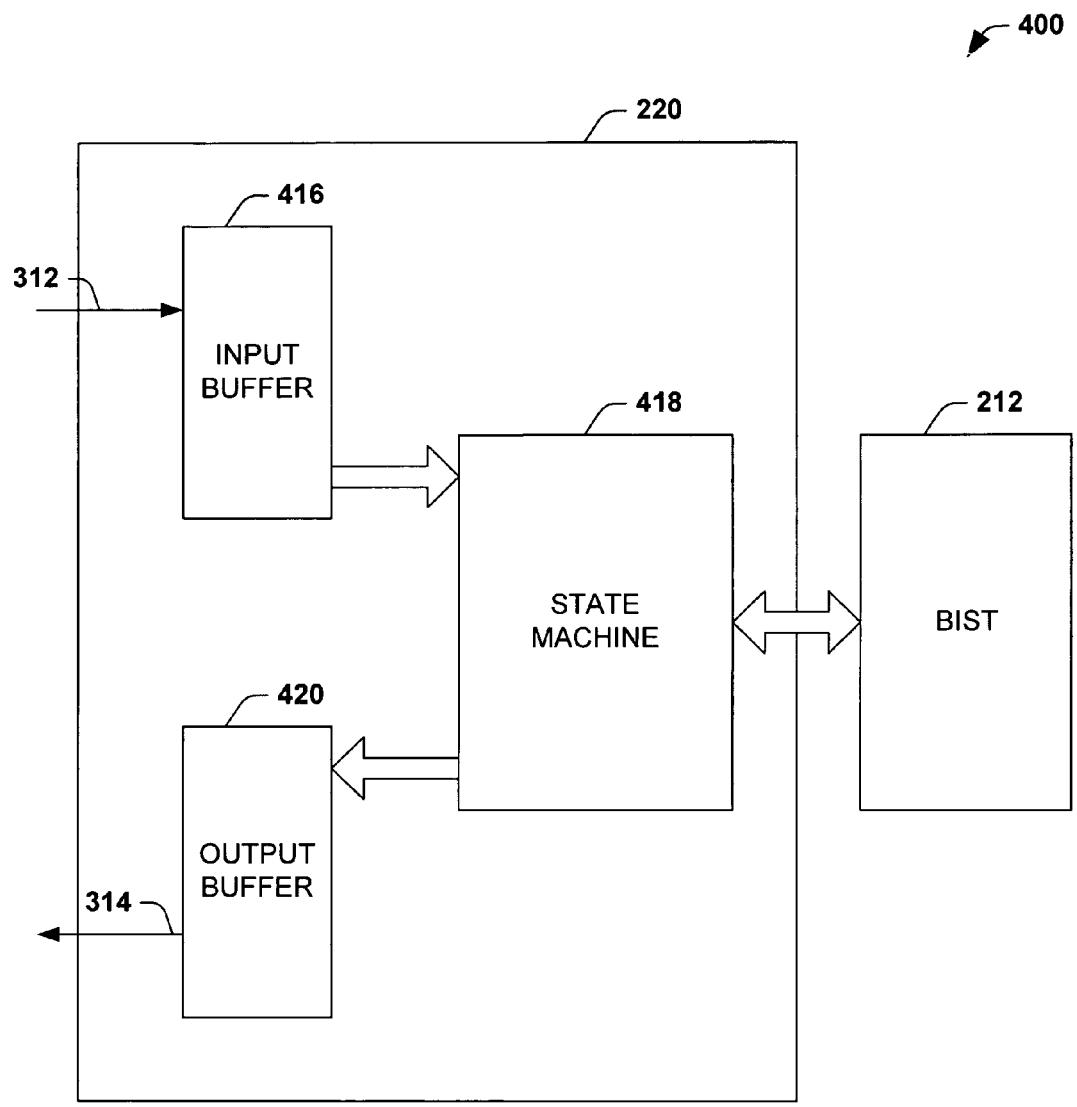
FIG. 4 is a block diagram of the BIST interface of the flash memory device of FIG. 4 in accordance with an aspect of the present invention.

FIG. 4 illustrates a block diagram of further details of the exemplary BIST interface 220 connected to the BIST circuit 212 similar to those depicted in FIGS. 2 and 3 in accordance with an aspect of the present invention. The BIST interface 220 has, for example, a serial input 312 connected to a serial input buffer 416 for serially communicating a sequence of global variables to the input buffer 416. The input buffer 416 is selectively coupled to a state machine 418 connected to the BIST circuit 212 for executing memory test sequences according to test conditions established by the global variables. The BIST interface 220 further includes, for example, a serial output 314 connected to a serial output buffer 420 selectively coupled to the state machine 418 to serially communicate the results of the memory tests executed by the state machine 418 as reported by the BIST circuit 212. Although the state machine 418 is illustrated as a single state machine for both input and output data in the present example, alternatively, separate state machines may be employed for input and output and such variations are contemplated by the present invention.

The operation, of the memory devices of FIGS. 1-4 will now be described in the context of the introduction and use of a new self-test protocol of the present invention. FIGS. 5A-D illustrate block diagrams of several exemplary sequences of the self-test protocol suitable for use in the memory devices of FIGS. 1-4 in accordance with an aspect of the present invention. The protocol includes a test sequence 500, a global variable sequence 520, a command sequence 540, and a test results sequence 560 of FIGS. 5A, 5B, 5C, and 5D, respectively.

According to the self-test protocol and one aspect of the invention, the illustrated sequences are, for example, a serial string of multi-bit binary codes. The test sequence 500 and variable sequence 520 may be further combined in accordance with the protocol to form a serial input sequence identified as the command sequence 540. Similarly, the test results sequence 560 and the command sequence 540 may be further combined in accordance with the protocol to form a serial output sequence. The serial output sequence returns the test results together with the data, which serves as a confirmation of the test conditions used and the tests executed.

In accordance with one example of the self-test system and protocol of the present invention, for each BIST test (e.g., TEST1 . . . TESTn of test sequence 500), there may be associated variables (e.g., VAR1 . . . VARn of global variable sequence 520) that define the test conditions (e.g., gate voltage, drain voltage, etc.) for each test. It should be noted, however, that some of the tests in the BIST flow sequence may not require associated test variables. The value of each variable is encoded in a number of bits (e.g., two bits, three bits). For example, the code "10" could represent a gate voltage VG=3.7V for a given test. A sample list of variables associated with various tests in the BIST test flow will be discussed further in connection with FIG. 10 (Global variable settings). All of the variables are input (e.g., serially) in a predefined testing sequence (see sample test sequence 600 of FIG. 6A, and sample global variable sequence 650 of FIG. 6B).

Several of the goals for the BIST interface 220 are to minimize the design complexity and the number of the input registers required, while maintaining the flexibility needed to successfully implement BIST in production. Thus, the self-test protocol implemented in the BIST interface 220 is organized and discussed in the following.

Figure 5A:
FIGS. 5A-5D are block diagrams of an exemplary test sequence, global variable sequence, command sequence, and test results sequence of codes, respectively, for the self-test protocol used in accordance with an aspect of the present invention.

The test sequence 500 of FIG. 5A is a fixed sequence. For example, FIG. 6A illustrates a sample three test sequence 600 including a reference trimming test #1 (e.g., TEST1), followed by a checkerboard program and read test #2 (e.g., TEST2), followed by an erase test #3 (e.g., TEST3). Each of these tests is known to follow in a predetermined order (e.g., TEST1, TEST2, TEST3, . . . TESTn of test sequence 500), and thus the variables present are associated with the test by their order in the sequence. Furthermore, each test in the sequence can be turned "ON" or "OFF" by inputting an associated "1" or a "0", as indicated by ON/OFF test indicators 542 of the command sequence 540 of FIG. 5C. In one implementation of the present invention, the test sequence is divided into two portions, with each portion pre-defined and assigned a specific three-bit test code, for example, TEST CODE1 544, and TEST CODE2 546 are three-bit codes used to identify whether GLOBAL VARIABLE SETTINGS 520 or ON/OFF TEST INDICATORS 542 are to follow.

Figure 5B:

The global variable (VAR) settings sequence 520 of FIG. 5B is input by the user in a pre-defined sequence (e.g., VAR1 . . . VARn of global variable sequence 520) to set the voltages for the associated tests (e.g., programming VG level is a global variable and will be used for diagonal, CKBD, and zeroes programming).

For example, FIG. 6B illustrates a sample variable sequence 650 which is associated with the three test sequences 600 of FIG. 6A. Note that in the present example, a given test will use one or more variables, wherein the value represented by the data bits provides the actual variable value. It is further noted in the present example, that a specific ordering of such variables is not required as in some serial communications. For example, a test sequence may include five tests, wherein three of the tests are programming tests. All three of the programming tests might use the $V_D$PROG and $V_G$PROG variables, regardless of their position in the test sequence. In addition, it should be noted that FIGS. 6A and 6B represent only one of the test and global variable sequences, 600 and 650 respectively, and that there are other sequences included as part of the BIST interface that use the other variables.

The example of FIG. 6B indicates that a repair selection (Value=1) has been made in a first sequence position 651 correlating to the checkerboard program and read test #2 (e.g., TEST2). In a second sequence position 652 correlating to the reference trimming test #1 (e.g., TEST1), a program drain voltage is to be set to a value=01 (e.g., VD PROG=4.5V). In an eighth sequence position 658 correlating to the erase test #3 (e.g., TEST3), a max erase pulse count for erasure of a sector is to be set to a value=0111 (e.g., max erase pulses=32). Each pre-defined variable sequence 520 is assigned, for example, a three-bit, four-bit, or another such multi-bit test code 544, see FIG. 10 (Global variable settings) for detailed information of the global variables.

Figure 5C:
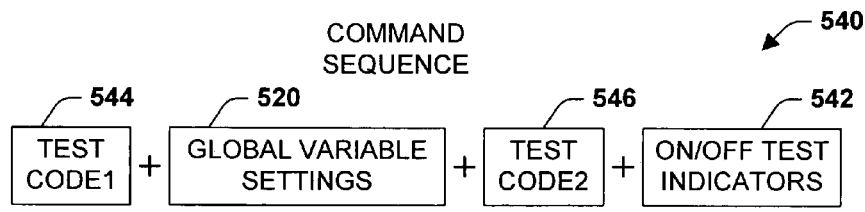

The command sequence 540 of FIG. 5C illustrates that each BIST test of sequence 500 also has a corresponding bit which functions as an "on/off" indicator (e.g., indicator sequence 542), to indicate whether that test should be performed as part of the BIST test flow. Consequently, every test may be included in the command sequence with any given test selectively eliminated using the on/off test indicator sequence 542 to turn off a given test. The indicator sequence 542 is also preceded by, for example, a three-bit, four-bit, or another such multi-bit test code 546. The test codes (e.g., 544, 546) are specific to each global variable or test sequence, and the BIST state machine (e.g., 418) uses the test code to determine what it should do with the information that was input (e.g., at serial input 312 to BIST interface 220). The multi-bit test code 544, 546, could be any number of bits, depending on how many global variables 520 and test sequences 500 are included as part of the BIST. The command sequence 540 combines the global variable sequence 520 portion with the on/off indicator sequence 542 portion. Note, that in the following example, that the test sequence 500 of FIG. 5A correlates to that of the ON/OFF test indicators 542 of FIG. 5C. Each portion (e.g., 2 portions) of the command sequence 540 is preceded by a corresponding test code (e.g., 542, 546) and will have the following form:

$$\underset{(010)}{\text{Test Code1}} + \underset{(11\ 01\ 10\ 1\ \ldots\ )}{\text{Global variable Settings}} +$$

$$\underset{(110)}{\text{Test Code2}} + \underset{(1\ 1\ 1\ 1\ 0\ 1\ 1\ 1\ \ldots\ )}{\text{On/Off Indicator for Tests}}$$

The appropriate tests are executed upon receipt of an "execute command" after the test sequence has been input (e.g., at serial input 312 to BIST interface 220). Minimizing the total bits in the command sequence minimizes the number of registers needed for the BIST interface, which minimizes the amount of die area needed. To minimize the total bits required for the command sequence, in accordance with one aspect of the present invention, each global variable and test sequence can be limited to a certain length, such that the entire test flow comprises executing several command sequences.

For example, a complete test flow might comprise two command sequences, each sequence comprising a global variable sequence and a test sequence:

a) 1st command sequence $$\underset{(001)}{\text{Test Code1}} + \underset{(11\ 01\ 10\ 1)}{\text{Global Variable Seq. 1}} + \underset{(010)}{\text{Test Code2}} + \underset{(1\ 1\ 1\ 1\ 0\ 1\ 1)}{\text{Test Seq. 1}}$$

b) 2nd command sequence:

$$\underset{(011)}{\text{Test Code3}} + \underset{(00\ 01\ 11)}{\text{Global Variable Seq. 2}} +$$

$$\underset{(100)}{\text{Test Code4}} + \underset{(1\ 1\ 0\ 1\ 1\ 1\ 0\ 1)}{\text{Test Seq. 2}}$$

The aforementioned demonstrates that, in accordance with the present implementation of the invention, there are two different global variable sequences and two different test sequences, wherein each sequence is assigned a unique test code. It should be noted that these sequences may not necessarily be of the same length (e.g., test sequence one (Seq. 1) has 7 tests, and test sequence two (Seq. 2) has 8 tests.

Figure 5D:
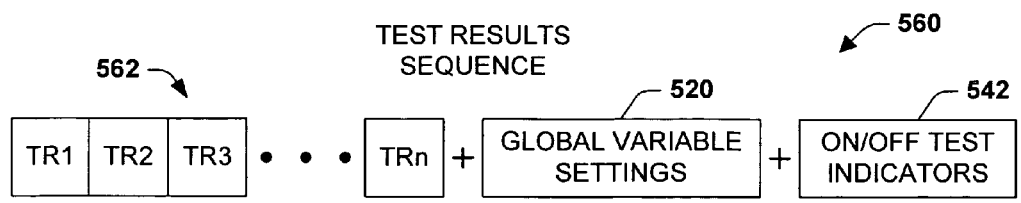

The test results (TR) sequence 560 of FIG. 5D illustrates that each test has a corresponding test result in the same pre-determined order (e.g., TR1 . . . TRn of test result sequence 560), and that an exemplary Output Sequence includes a sequence of test results 562, the global variable settings 520, and the ON/OFF TEST INDICATORS 542. FIG. 6C illustrates a sample test results sequence 700 based on the sample input test sequence 600 of FIG. 6A. As illustrated in the table 750 of FIG. 7, each test result output (e.g., serial output 314 from BIST interface 220) comprises a code (e.g., two bits) to indicate Pass (P), Fail (F), Pass with repair (P w/rpr), and Fail with repair (F w/rpr). Referring back to FIG. 6C, the first test result of the reference trimming test #1 produces a test result value=00, which corresponds to a Pass result from the code definitions table 750 of FIG. 7. In the second checkerboard pattern program and read test #2, the test result value=01, corresponding to a Fail result. In the third erase test #3, the test result value=10, corresponding to a Pass with Repair result.

The output is a serial stream consisting of the test results for each test, followed by the input sequence of the global variable settings and the on/off indicators for each test in the sequence. The order of the data corresponds to the order in which the tests were executed.

For example, the Output Sequence for part (a) in the example above is as follows:

$$\underset{01}{(TR\#1)} + \underset{00}{(TR\#2)} + \ldots + \underset{11}{(TR\#7)} +$$

$$\underset{(1\ 1\ 01\ 10\ 1)}{(Global\ Variable\ Settings)} + \underset{(1\ 1\ 1\ 1\ 0\ 1\ 1)}{(On/off\ Test\ Indicators)}$$

A self-test protocol implemented in BIST circuitry facilitates the method of the present invention. The method permits adjustment of the test conditions of BIST circuitry utilized for testing a sector or array of Flash memory cells, reduces device testing cost and time by enabling testing of all die on a wafer simultaneously. The method further reduces device testing costs by enabling software adjustment of the test conditions utilized by BIST circuitry, thereby eliminating the need to do so via mask changes that may be prohibitively expensive and time consuming.

Figure 8:
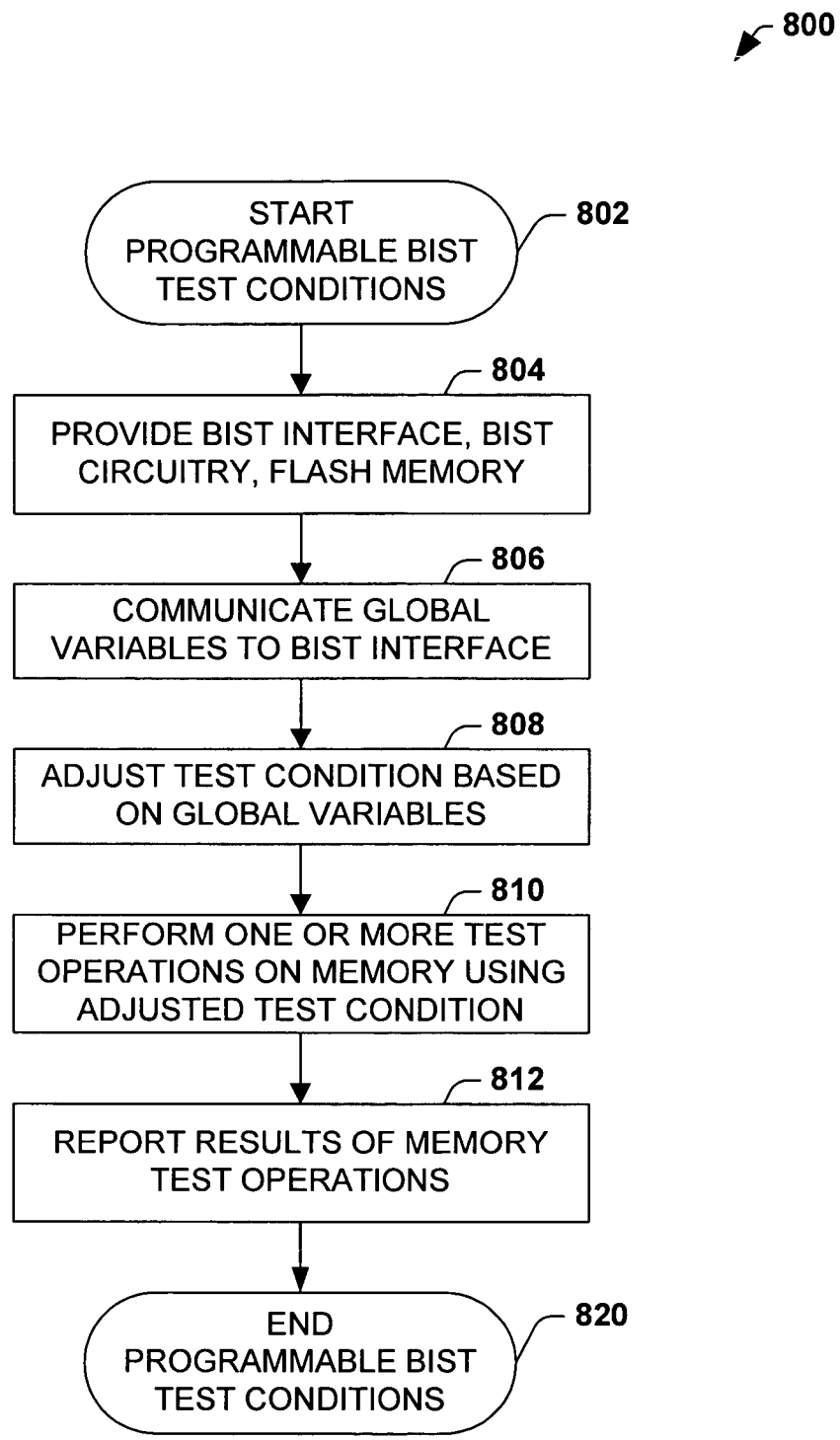
FIG. 8 is a flow diagram illustrating an exemplary method of adjusting the test conditions of BIST circuitry for testing a sector or array of Flash memory cells in accordance with an aspect of the present invention.

FIGS. 8 and 9 illustrate exemplary flow diagrams of a self-test method 800 and an exemplary deprogramming stress test 900 of the method of FIG. 8, respectively, according to the protocol of the present invention. Although the methodology is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

FIG. 8 illustrates a flow diagram of an exemplary self-test method 800 for adjusting the test conditions of BIST circuitry utilized for testing a sector or array of Flash memory cells in accordance with an aspect of the present invention. The self-test method 800 comprises providing a BIST circuit 212, a BIST interface 220, and a sector or array of Flash memory cells 310, and communicating (e.g., serially) a predetermined sequence of global variables associated with a predetermined sequence of tests to the BIST interface 220. The self-test method then adjusts the test conditions based on the values of the global variables and performs the tests and reports the results of the tests in a predetermined sequence. Steps 806-812 of FIG. 8 correspond to a command sequence, and may be repeated any number of times to execute the complete test flow. Further, any number of global variables associated with any number of tests may be used, for example, to tailor the test conditions. A default variable value, and a default maximum number of pulses (e.g., CKBD prog, DIAG prog, max erase pulses), for example, may be provided in hardware in accordance with an aspect of the invention.

For example, the self-test method 800 according to the self-test protocol begins at 802 (e.g., using BIST circuitry), wherein a memory device (e.g., 100, 200, and 300) is provided at 804, comprising a BIST circuitry 212, BIST interface 220, and an embedded, or associated sector or array of Flash memory cells 310. At 806 a predetermined sequence of global variables (VAR1 . . . VARn 520), along with the associated predetermined sequence of tests (TEST1 . . . TESTn 500) is communicated (e.g., a serial command sequence 540) to the BIST interface 220, for example, to serial input buffer 416 via serial input 312.

The self-test method 800 then adjusts the test conditions at 808 based on the values (e.g., multi-bit binary codes representing values) of the global variables 520 associated with the tests 500 and executes the tests at 810 through the BIST interface 220 (e.g., via the state machine 418) and the BIST circuitry 212, on the Flash memory 310. At 812, method 800 reports the results TR1 . . . TRn 560 of the tests 500 in a predetermined sequence (e.g., a serial output sequence 540) from the BIST interface 220, for example, from serial output buffer 420 to serial output 314. Thereafter the method 800 ends at 820, wherein further BIST tests may be performed on the memory based on test conditions adjusted according to user programmed global variables, by repeating steps 806, 808, 810, and 812.

FIG. 9 illustrates a flow diagram of the exemplary deprogramming stress test 900, which is one of the tests that may be performed in accordance with the method 800 of the present invention.

For example, initially, before the deprogramming stress test 900 begins, variables associated with the stress test are communicated to the BIST interface 220 and the associated test conditions are adjusted. For example, the gate voltage may be adjusted based on a two bit gate voltage value 1002 of FIG. 10, and a one-bit selection variable 1004 of FIG. 10 may be used to select whether both deprogramming+read tests are given, or whether a "read only" test is done. Further, a repair/no-repair selection (e.g., wherein a "1" selects the test condition and a "0" deselects the test condition) may also be made for the test 900 based on variable 1006 of FIG. 10 to allow repair, after a fail condition is determined, on tests which have repair capability (e.g., 906, 908, 910).

The deprogramming stress test 900 of the method then begins at 902 (e.g., using and executed by BIST circuitry), wherein the BIST circuitry initiates a deprogramming stress upon the embedded or associated array of memory cells. At 904 the memory is erased. At 906, a blank read test is performed on each word of the array followed by a verify and repair operation at 907, which will be illustrated and described in further detail in the verify and repair operation method 950 of FIG. 9B to follow. Essentially, the verify and repair operation method 950 verifies whether a read test has passed and repairs the array portion if the read test fails. A program and read test is then performed on the array at 908 followed by another verify and repair operation (e.g., similar to that of method 950) at 909. A test "deprogramming+read" or "read only" test is then performed on the array at 910 based on the initial selection made during the test condition adjustment phase of method 800 followed by another verify and repair operation (e.g., similar to that of method 950) at 911 and the method 900 ends at 917, wherein further BIST tests may be performed on the memory based on test conditions adjusted according to software controlled global variables.

Figure 9A:
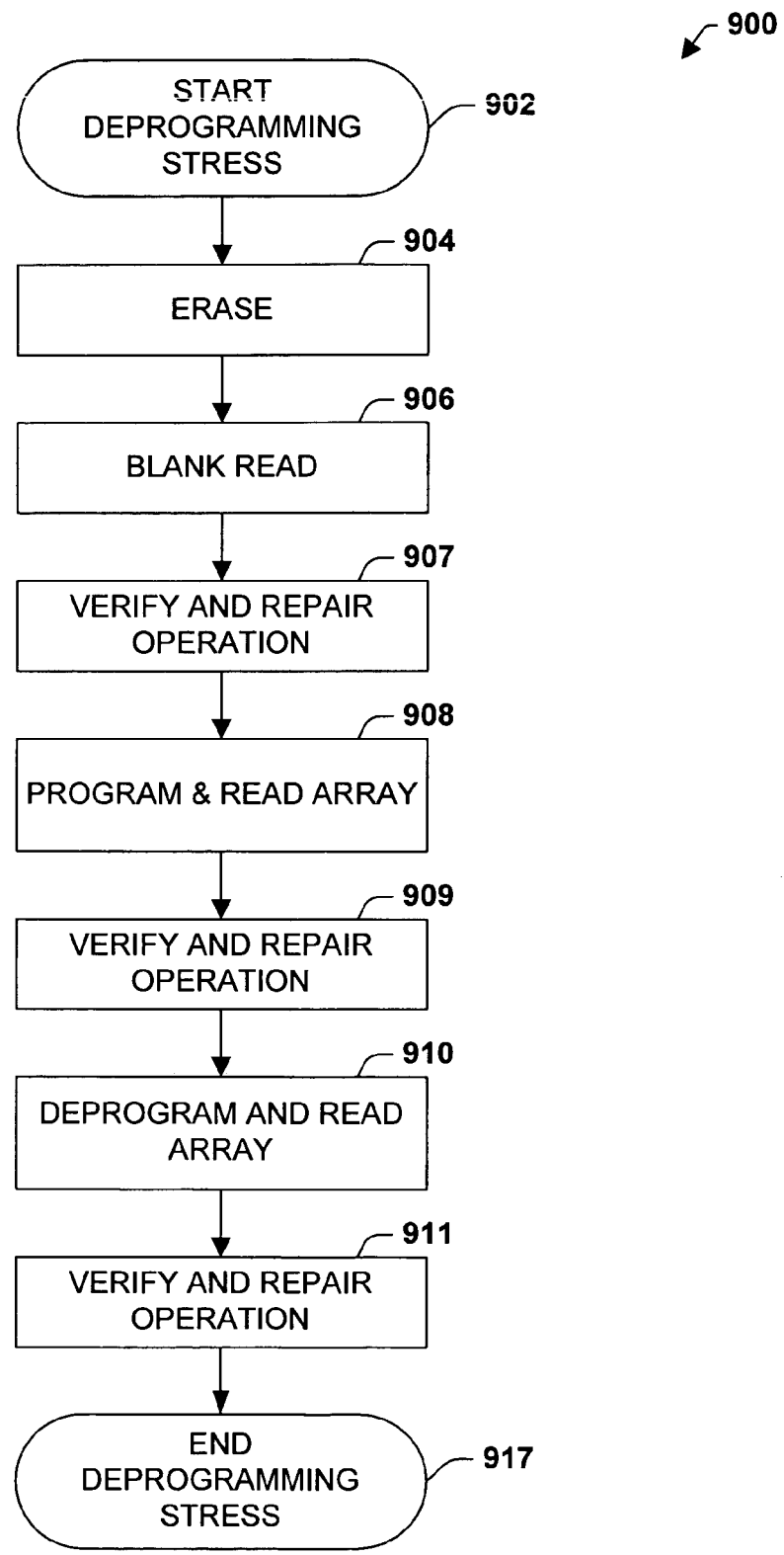
FIG. 9A is a flow diagram further illustrating one exemplary test of the method of FIG. 8, of adjusting the test conditions of BIST circuitry for testing a sector or array of Flash memory cells in accordance with an aspect of the present invention.
Figure 9B:
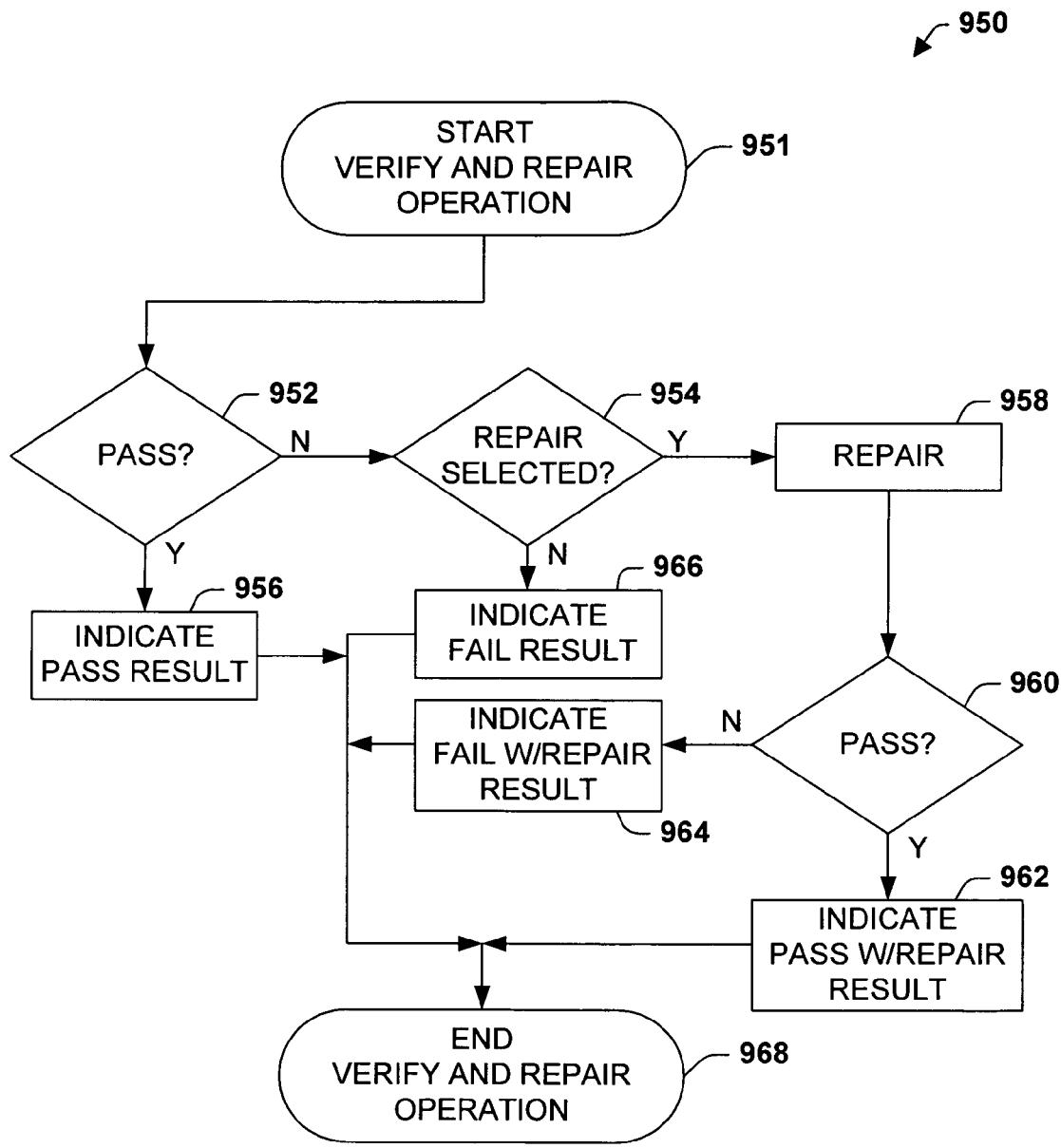
FIG. 9B is a flow diagram further illustrating one exemplary test verify and repair operation method as may be used in the test of FIG. 9A, in accordance with an aspect of the present invention.

As indicated above, the verify and repair operation method 950 of FIG. 9B verifies whether a read test has passed and repairs the array portion if one of the read tests of FIG. 9A fails. For example, the blank read of 906, the program and read array of 908, and the deprogram and read array test of FIG. 9A is tested at 952 to determine whether the test result indicates a pass or fail test result.

If the test was determined to have passed at 952, a "Pass" result is indicated at 956 and the method ends at 968. If, on the other hand the test was determined to have failed at 952, and a repair selection was initially made as determined at 954, a repair is made at 958 and the test is re-evaluated whether it now passes at 960. If at 960 it is determined that the repair has now provided a passing memory, a "Pass with repair" result is indicated at 962 and the method ends at 968. If, however, at 960 it is determined that the repair has failed, a "Fail with repair" result is indicated at 964 and the method ends at 968. Thereafter, if the memory has not passed at 952 and a repair was not selected as determined at 954, then a "Fail" result is indicated at 966 and the method 950 ends at 968, wherein further BIST tests may be performed on the memory based on test conditions adjusted according to user software controlled global variables.

FIG. 10 illustrates a table 1000 of exemplary global variable settings as may be used in the global variable and command sequences illustrated in FIGS. 5B and 5C for the self-test protocol of the present invention. In the case of the CKBD PROG and DIAG PROG variables, each step of the 16 steps would correspond to 64 pulses each, such that step 16 would correspond to 512 pulses. Table 1000 further illustrates an exemplary number of bits that may be used to identify the value of each variable. The value may refer to an absolute value or may refer to an offset from a default value. In the latter case, Table 1000 also indicates a number of possible steps offset, which the value may represent relative to the default value. For example, using the default value concept, a two-bit value of "11" may represent three voltage steps of offset relative to a default gate voltage value of 3.5V, wherein each offset step represents 0.2V. Thus, the final gate voltage adjustment would be:

$$3.5V + 0.2V \times 3 = 3.5V + 0.6V = 4.1V$$

A variety of other current, voltage, pulse count, and test selection criteria associated with any number and types of tests are anticipated in the context of the self-test system and protocol of the present invention.

Figure 11:
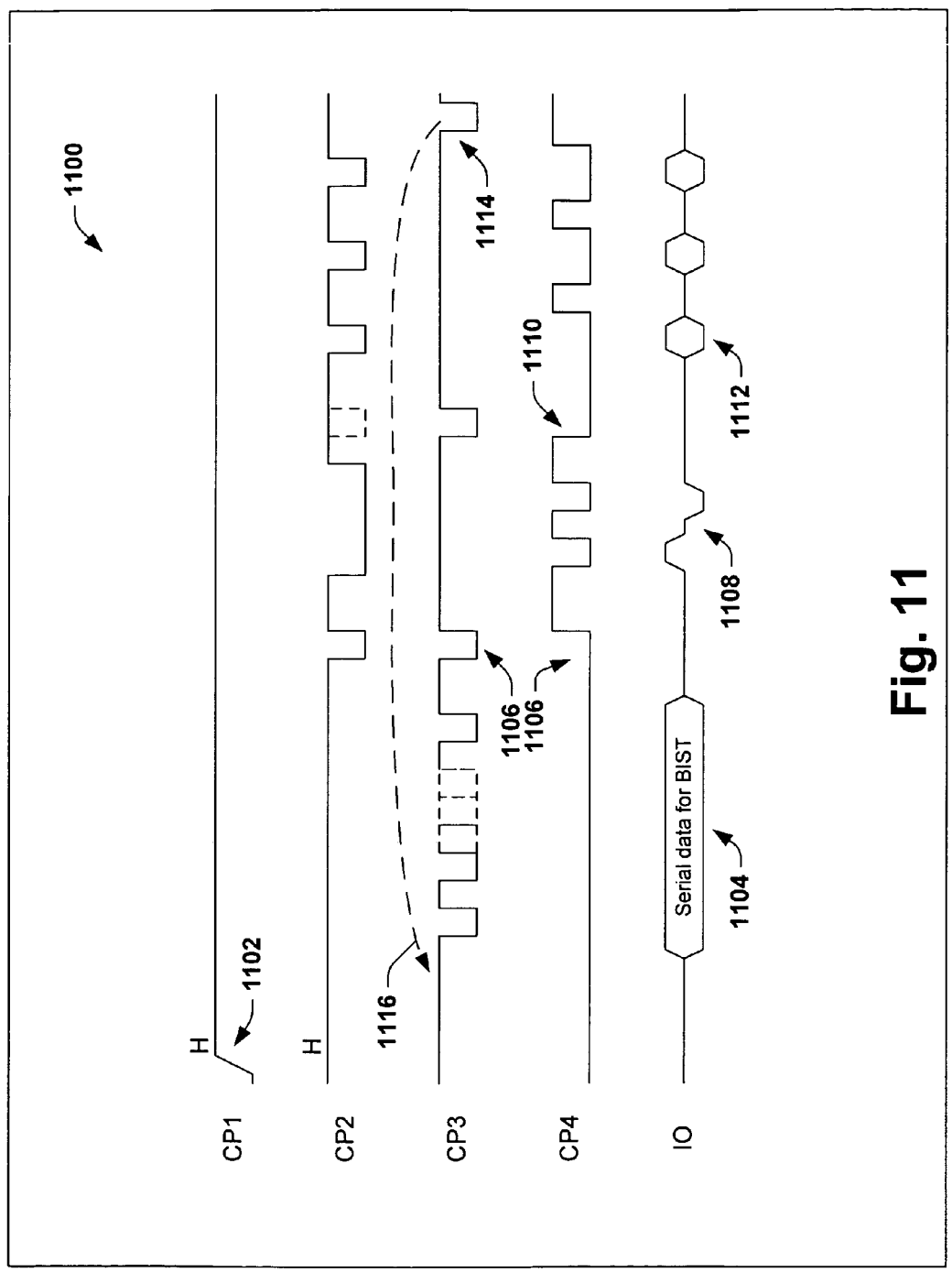
FIG. 11 is an exemplary simplified timing diagram of the self-test system and protocol of the present invention.

FIG. 11 illustrates an exemplary timing diagram 1100 of the self-test system operating in accordance with the self-test protocol of the present invention. In timing diagram 1100:

Control Pins 1-4 (CP1-CP4) generate control signals used during BIST testing, I/O is an Input/Output for giving inputs to and getting outputs from the BIST state machine.

The BIST test mode is activated when control pin 1 CP1 goes high at 1102 of timing diagram 1100. The IO bus inputs serial data, for example, the command sequence 540 of FIG. 5C, for the BIST. This IO bus must not be common or shared, but an independent signal to each device. After CP1 goes high, CP3 is clocked to latch in the code on the IO. Once the self-test mode is invoked at 1104, the serial data is latched in. The length of the serial data depends on the mode selected (refer to the BIST serial data sequences of FIGS. 5A-5D). The first three bits of the serial data correspond to the test code for the sequence (refer to 544 and 546 of FIG. 5C).

Time 1106, is the Execute command to start execution of BIST. All three of the CP2, CP3, and CP4 signals go low during this time. At 1108 the status of the memory device is polled. If self-test has completed, IO will be "0", otherwise if the self-test has not completed, it will be "1". CP4 pin needs to be an independent bus input to allow polling of one device at a time and to avoid bus contention.

Time 1110 on the CP4 signal marks the Read command to start reading out results (CP3 and CP4=low). At 1112, the self-test results and the initial self-test set-up data are read out. CP2 pulse must be within the CP4 pulse. 1114, is the Reset command. CP3 is low while both CP2 and CP4 are high. Thereafter, the memory device loops back to the states illustrated by 1116. To exit the self-test mode, CP1 goes low and Vcc is removed from the BIST circuitry.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A system for providing programmable test conditions for a built-in self test circuit of a memory device, the system comprising:
a flash memory;
a BIST interface circuit adapted to receive one or more global variables associated with the test conditions of a plurality of memory tests used on the flash memory and to output results of the memory tests based on the value of the variables, wherein the global variables are shared between the plurality of memory tests; and
wherein the global variables comprise one or more of:
a drain voltage, a gate voltage, a reference voltage, a reference current, a number of pulses used in a checker board pattern test, a number of pulses used in a diagonal pattern test, a number of pulses used in an erase test, a number of pulses used in a zeroes program test, a repair/no repair selection, a program stress and read/read only selection, and a pattern to be used during a read test; and
wherein test conditions associated with the global variables comprise:
a drain voltage value, a gate voltage value, a reference voltage value, a reference current value, a maximum number of pulses used in a checker board pattern test, a maximum number of pulses used in a diagonal pattern test, a maximum number of pulses used in an erase test, a maximum number of pulses used in a zeroes program test, selection of one of a repair/no repair, selection of one of a program stress and read/read only, and selection of one of a read test pattern, respectively; and wherein the BIST interface circuit is adapted to adjust one or more test conditions of the shared global variables based on one or more earlier test results and use the adjusted one or more test conditions in an additional test; and a BIST circuit adapted to test operations of the flash memory based on the value of the variables programmed into the test conditions and to report results of the memory tests.

2. The system of claim 1, further comprising a communications medium for communicating the global variables to the BIST interface and test results from the interface.

3. The system of claim 2, wherein the communications is between the BIST interface and automated test equipment located external to an integrated circuit comprising the BIST circuit.

4. The system of claim 2, wherein the communications medium is a serial communications medium.

5. The system of claim 4, wherein the serial communications is accomplished between the BIST interface and automated test equipment located external to an integrated circuit comprising the BIST circuit.

6. The system of claim 4, wherein each global variable used in the serial communications is associated with a default variable value.

7. The system of claim 6, wherein the value of each global variable further comprises an offset value associated with the default value.

8. The system of claim 7, wherein the global variable is represented by a multi-bit binary code for computing a programmed number of steps of offset from the default value.

9. The system of claim 6, wherein the default value of each global variable is hardwired in the circuit.

10. The system of claim 4, wherein a global variable used in the serial communications medium represents a voltage value.

11. The system of claim 4, wherein the serial communications comprises a predetermined command sequence comprising:
a first predetermined test code before a global variable sequence; and
a second predetermined test code before an on/off test indications sequence.

12. The system of claim 11, wherein the first and second predetermined test codes are multi-bit binary code representations.

13. The system of claim 11, wherein the predetermined on/off test indications are one-bit binary code representations wherein a first state deactivates the test and a second state activates the test.

14. The system of claim 11, wherein the serial communications further comprises a test results sequence comprising:
a predetermined sequence of test result indications, wherein the testing result of each test is represented by a result code.

15. The system of claim 14, wherein the test result indications are reported by the BIST circuit and output from the BIST interface, and wherein such test result indications are in an order associated with an input test sequence.

16. The system of claim 11, wherein the command sequence and the test sequence are divided into two or more corresponding portions.

17. The system of claim 1, wherein the BIST interface circuit comprises:
a state machine coupled to the BIST circuit for executing test sequences according to test conditions established by the global variables;
an input buffer to communicate the global variables to the state machine; and
an output buffer to communicate the results of the tests executed from the state machine.

18. The system of claim 17, wherein the communications with the BIST interface is a serial communications medium.

19. The system of claim 17, wherein the serial communications is accomplished between the BIST interface and automated test equipment located external to an integrated circuit comprising the BIST circuit.

20. The system of claim 1, wherein the BIST interface is adapted to execute a test sequence on more than one BIST circuit.

21. The system of claim 1, further comprising at least one redundant circuit provided for repair purposes based on results of the test operations.

22. The system of claim 21, wherein the BIST interface is adapted to direct the BIST circuit to repair a failure.

23. The system of claim 21, wherein the BIST circuit is configured to repair or replace a failed memory cell.

24. The system of claim 23, wherein the interactive adjustment of the test conditions comprises adjusting the test conditions of subsequent tests based on the test results reported by a first test and shared among the plurality of tests using the global variables.

25. The system of claim 1, wherein the system is adapted to direct the BIST circuit to repair a failure via automated test equipment located external to an integrated circuit comprising the BIST circuit.

26. The system of claim 1, wherein the one or more global variables comprise one or more bits of a multi-bit code corresponding to the one of a drain voltage, a gate voltage, a reference voltage, a reference current, a number of pulses used in a checker board pattern test, a number of pulses used in a diagonal pattern test, a number of pulses used in an erase test, a number of pulses used in a zeroes program test, a repair/no repair selection, a program stress and read/read only selection, and a pattern to be used during a read test.

27. The system of claim 1, wherein the value of each global variable comprises a default value offset by a programmed value corresponding to one of a drain voltage value, a gate voltage value, a reference voltage value, a reference current value, a maximum number of pulses used in a checker board pattern test, a maximum number of pulses used in a diagonal pattern test, a maximum number of pulses used in an erase test, a maximum number of pulses used in a zeroes program test, selection of one of a repair/no repair selection, selection of one of a program stress and read/read only selection, and selection of one of a read test pattern, respectively.

28. The system of claim 27, wherein the global variables are input by a user during operations of a memory test.

29. The system of claim 1, wherein the BIST interface is an integral portion of the BIST circuitry.

30. The system of claim 1, wherein the global variables are further used to trim a voltage or current reference used in one or more flash memory tests and operations.

31. The system of claim 1, wherein the global variables are further operable to interactively adjust the test conditions used in the plurality of flash memory tests and operations thereof, wherein results obtained from a first test are used to adjust test conditions for other tests by way of the shared global variables.

32. The system of claim 31, wherein the interactive adjustment of the test conditions comprises adjusting the test conditions of a second test based on the test results reported after a first test.

33. A system for providing programmable test conditions for a built-in self test circuit of a memory device, the system comprising:
- a flash memory;
- a BIST interface circuit adapted to receive one or more global variables associated with the test conditions of a plurality of memory tests used on the flash memory and to output results of the memory tests based on the value of the variables, wherein the global variables are shared between the plurality of memory tests and are used to adjust the test conditions of the flash memory tests and operations thereof;
- a BIST circuit adapted to test operations of the flash memory based on the value of the variables programmed into the test conditions and to report results of the memory tests; and
- a serial communications medium for communicating the global variables to the BIST interface and test results from the interface, wherein the serial communications comprises a predetermined command sequence comprising:
  - a first predetermined test code before a global variable sequence;
  - a second predetermined test code before an on/off test indications sequence; and
  - a test results sequence comprising a predetermined sequence of test result indications, wherein the testing result of each test is represented by a result code, and wherein the test result indications are two-bit binary code representations comprising:
    00=Pass
    01=Fail
    10=Pass with Repair
    11=Fail with Repair.

34. A system for providing programmable test conditions for a built-in self test circuit of a memory device, the system comprising:
- a flash memory comprising an array of memory cells;
- a BIST interface circuit adapted to receive one or more global variables associated with the test conditions of a plurality of memory tests used on the flash memory and to output results of the memory tests based on the value of the variables, wherein the global variables are shared between the plurality of memory tests and are used to adjust the test conditions of the flash memory tests and operations thereof;
- a BIST circuit adapted to test operations of the flash memory based on the value of the variables programmed into the test conditions and to report results of the memory tests; and
- a serial communications medium for communicating the global variables to the BIST interface and test results from the interface, wherein the serial communications comprises a predetermined command sequence comprising:
  - a first predetermined test code before a global variable sequence; and
  - a second predetermined test code before an on/off test indications sequence, wherein the serial communications further comprises a test results sequence comprising a predetermined sequence of test result indications, and wherein the test result indications are two-bit binary code representations comprising:
    00=Pass
    01=Fail
    10=Pass with Repair
    11=Fail with Repair.

* * * * *